United States Patent [19]

Kitsuda et al.

[11] 4,399,257

[45] Aug. 16, 1983

[54] EPOXY RESIN COMPOSITION

[75] Inventors: Yoshihiro Kitsuda, Hirakata; Masaaki Ohtsu, Habikino; Masahiro Matsumura, Katano, all of Japan

[73] Assignee: Matsushita Electric Works, Ltd., Osaka, Japan

[21] Appl. No.: 261,908

[22] Filed: May 8, 1981

[30] Foreign Application Priority Data

| May 10, 1980 [JP] | Japan | 55-62101 |
| Oct. 30, 1980 [JP] | Japan | 55-153341 |
| Oct. 30, 1980 [JP] | Japan | 55-153342 |
| Dec. 13, 1980 [JP] | Japan | 55-176106 |

[51] Int. Cl.$^3$ .................. C08L 29/02; C08L 63/00
[52] U.S. Cl. ................. 525/118; 525/108; 428/417
[58] Field of Search .................. 525/109, 118

[56] References Cited

U.S. PATENT DOCUMENTS

| 3,884,992 | 5/1975 | Shimizu et al. | 525/118 |
| 4,021,403 | 5/1977 | Fujiwara et al. | 525/108 |

FOREIGN PATENT DOCUMENTS

| 53-71300 | 6/1978 | Japan | 525/109 |
| 53-90400 | 8/1978 | Japan | 525/118 |
| 55-25474 | 2/1980 | Japan | 525/109 |
| 55-48216 | 4/1980 | Japan | 525/109 |

Primary Examiner—John C. Bleutge
Assistant Examiner—Robert E. L. Sellers
Attorney, Agent, or Firm—Koda and Androlia

[57] ABSTRACT

An epoxy resin composition containing one or a mixture thereof selected from the group consisting of poly-p-vinyl phenol and its halides, and a compound selected from the group consisting of the following compounds: (a) Sn salt of organic acid wherein at least one organic group is bonded with Sn atom; (b) alcoxy-containing silane compound represented by the general formula, $(R'-)_n-Si-(-OR)_{4-n}$, wherein R' denotes the alkyl group or the allyl group, R denotes the normal chain or branched alkyl group, and n denotes 0 or an integer of 1-4; and (c) aluminic acid ester represented by the general formula, $[Al(OR)_3]_n$, wherein n denotes an integer of 1-5, and R denotes the alkyl group or allyl group. The present invention further includes a method for preparing an epoxy resin prepreg using the above epoxy resin composition.

12 Claims, No Drawings

EPOXY RESIN COMPOSITION

BACKGROUND OF THE INVENTION

1. Field of the Invention

The present invention relates to an epoxy resin composition, and more particularly to hardening agents and hardening promotor for epoxy resin composition.

2. Description of the Prior Art

There have been known a number of hardening agents for epoxy resin, such as polyfunctional aromatic amine, dicyandiamide, acid anhydride, BF3 complex, etc. In the prior art, Japanese Patent Publication No. 52-92280 teaches BF3.amine complex, Japanese Patent Publication No. 53-90400 teaches imidazol derivative, Japanese Patent Publication No. 53-114900 teaches a complex of organic amine and Lewis acid or Brensted acid, Japanese Patent Publication No. 53-121825 teaches five (or six) numbered heterocycle amine and Japanese Patent Publication No. 54-25999 teaches amine carbonate. However, such hardening agents and hardening promotor as mentioned above were not able to satisfactorily improve the heat resistance of the hardened epoxy resin obtained. Due to such disadvantage, a circuit substrate made of the aforementioned epoxy resin hardening agent barely sasisfies the requirements of highly advanced circuit techology. More specifically, the highly increased wiring density on the circuit substrate demands extremely high heat resistance in the material. The existing epoxy resin does not provide such high heat resistance, and therefore improvements have been needed on this aspect. In addition, the epoxy resin product containing the aforesaid hardeners was short in gelation time, and has other drawbacks, such as the difficulty in handling, the occurrence of gelation during storage.

SUMMARY OF THE INVENTION

It is the primary object of this invention to provide an epoxy resin composition that has higher heat resistance.

It is another object of this invention to provide an epoxy resin composition that has longer gelation time.

It is still another object of this invention to provide a method for producing an epoxy resin prepreg with longer gelation time and higher heat resistance.

In keeping with the principles of this invention, the objects are achieved by a unique composition comprising at least either one of poly-p-vinyl phenol and its halides, and a compound selected from a group consisting of the following compounds: (a) Sn salt of organic acid containing at least one organic group bonded with Sn atom; (b) silane compound containing an alcoxy group, that is represented by a general formula, $(R'-)_n-Si-(-OR)_{4-n}$, wherein R' denotes an alkyl group or an allyl group, R indicates a normal chain or branched alkyl group and n denotes zero or an integer from 1 to 4; and (c) aluminic acid ester represented by a general formula, $[Al(OR)_3]_n$, wherein n represents an integer from 1 to 5 and R denotes an alkyl group or allyl group.

DETAILED DESCRIPTION OF THE INVENTION

The basic concept of this invention is to obtain an excellent epoxy resin composition through the improvement of hardening agents and hardening promoter.

There is no specific limit set as to the type of resin used for the epoxy resin composition of this invention, so long as it is a compound containing 2 or more epoxy groups in its molecule. In general, however, a common epoxy resin with equivalent ranging from 100 to 4000 is used. The preferred epoxy resins of such type include bisphenol type epoxy resin, alicyclic epoxy resin, novolak type epoxy resin, nitrogen-bearing epoxy resin, and a halogenated epoxy resin, such as brominated epoxy resin.

Poly-p-vinyl phenol used as a hardening agent is obtained by thermal polymerization of p-vinyl phenol monomer, and the preferable one is that having a weight average molecular weight (hereinafter referred to as MW) of 3000–8000. Also, instead of poly-p-vinyl phenol, or together with poly-p-vinyl phenol, a halide of poly-p-vinyl phenol wherein halogen is introduced in phenol nucleus may be used. Such a type of poly-p-phenol is commercially available for Maruzen Sekiyu Co. by a name "Resin M", and its bromide is marketed in the name "Resin MB", by the same company.

The composition by weight of such a type of hardening agent is usually set to be 0.5–2.0 in molar ratio of (epoxy group of epoxy resin)/(active hydrogen of hardener). The reason for the above is that when said molar ratio is out of this range, the heat resistance of the epoxy resin product obtained tends to decrease.

As a hardening agent, at least either one of poly-p-vinyl phenol and its halide is used.

As a hardening promoter, basically, one of the following three types of compounds is used.

(1) Sn salt of organic acid, wherein at least one organic group is bonded with Sn atom.

(2) Alcoxy group containing silane compound represented by the following general formula,

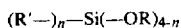

$$(R'-)_n-Si(-OR)_{4-n}$$

wherein R' indicates an alkyl group or an allyl group, R denotes a normal chain or branched alkyl group, and n indicates 0 or an integer from 1 to 4.

(3) aluminic acid ester represented by the following general formula,

$$[Al(OR)_3]_n$$

wherein n denotes an integer of 1–5, and R represents an allkyl group or an allyl group.

First, a description will be given on an embodiment using the Sn salt shown in (1) in the above. As the Sn salt in said embodiment, a compound represented by the following general formulae (I)–(III) is used.

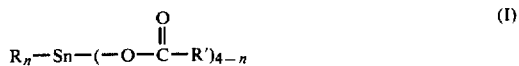

In the formula shown above, R is a monovalent organic group, R' is an organic acid residue with or without free carboxyl group, and n is an integer of 1–3.

In the formula shown above, R and R' are same as those in the foregoing formula (I). However, both R and R' may be identical or different.

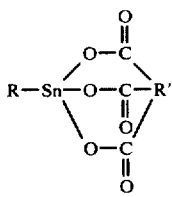

(III)

In the formula shown above, R and R' are same as those in the foregoing formula (I).

To be more precise, as the monovalent organic group R in abovementioned formulas (I)–(III), practically, the following are preferable: methyl group, ethyl group, n-propyl group, iso-propyl group, n-butyl group, iso-butyl group, sec-butyl group, tert-butyl group, pentyl group, heptyl group, octyl group, nonyl group, decyl group, phenyl group, benzyl group, o-tolyl group, p-tolyl group, m-tolyl group, o-xylyl group, p-xylyl group, and m-xylyl group.

As organic acid residue R', practically the following are preferred: an acid residue of monobasic acids, such as acetic acid, octylic acid, lauric acid, benzoic acid; an acid residue of aromatic polybasic acids, such as phthalic acid, isophthalic acid, terephthalic acid, trimellitic acid; an acid residue of alicyclic polybasic acids, such as tetrahydrophthalic acid, hexahydrophthaic acid; and an acid residue of aliphatic polybasic acids, such as sebacic acid, adipic acid, maleic acid, itaconic acid, oxalic acid.

When an organic acid residue R' is an acid residue of polybasic acid, it may have a free carboxyl group. In other words, when the above-mentioned hardening promoter is formed through the bondage between polybasic acid and Sn atom, the polybasic acid may be bonded with the Sn atom by all of its carboxylic groups or by part of them.

Usually, the amount of hardening promoter to be added is selected to be 0.05–5.0 parts compared with 100 parts by weight (hereinafter, will be abbreviated as "pt.") of epoxy resin. That is because the maximum effect is obtained in this range in composition by weight.

As is apparent from the foregoing description, in the epoxy resin composition of this invention, the Sn salt of organic acid wherein at least one organic group is bonded with the Sn atom is mixed with at least either poly-p-vinyl phenol or its halide. As a result, the epoxy resin composition resulting is long in gelation time, thus allowing easy handling and contributing to the higher storage stability; also, it provides a hardened epoxy resin product with high heat resistance. Because of the merits as mentioned above, the epoxy resin composition of this invention is best suited for a prepreg for a circuit substrate.

Furthermore, if necessary, a publicly known hardening promotor may be compounded with the epoxy resin composition of this invention. As the publicly known hardening promotor, there are, for example, tertiary amines, Lewis acids, titanic acid esters, siloxane compound, acetylacetone metallic salt.

Next, the examples will be described together with the comparison examples.

EXAMPLE 1

One hundred pt. of bisphenol type epoxy resin (Epicote® 828, produced by Shell Co.) and 64 pt. of poly-p-vinyl phenol (MW=3,000, hydroxyl value=120, by Maruzen Sekiyu Co.) were dissolved in methyl ethyl ketone. Then, as the hardening promoter, 1 pt. of di-n-butyl tin dimaleate was added in the solution prepared as above, and an epoxy resin composite varnish of 50% by weight (hereinafter, will be abbreviated as "%") in concentration was prepared. Next, said epoxy resin composite varnish was dried under reduced pressure to remove the solvent. As a result, a solid matter was obtained. By heating said solid matter at 170° C. for 2 hours, then at 200° C. for 3 hours, a hardened epoxy resin product was obtained.

EXAMPLE 2

In place of di-n-butyl tin dimaleate, di-n-butyl tin dilaurate was used. By using the same method as in Example 1 other than the above, a hardened epoxy resin was obtained.

EXAMPLE 3

Instead of di-n-butyl tin dimaleate, dioctyl tin dilaurate was used. Except the above, the same method as in Example 1 was used, and a hardened epoxy resin was obtained.

EXAMPLE 4

One hundred pt. of novolak type epoxy resin (Epicote® 154, by Shell Co.) and 67 pt. of poly-p-vinyl phenol (MW=4000, Hydroxyl value=120, by Maruzen Sekiyu Co.) were dissolved in methyl ethyl ketone. Then, by adding 0.2 pt. of di-n-butyl tin diacetate as hardening promoter, an epoxy resin composite varnish was prepared. Thereafter, by using the same method as in Example 1, a hardened epoxy resin was obtained.

EXAMPLE 5

One hundred pt. of bisphenol type epoxy resin (Epicote® 828), 33 pt. of poly-p-vinyl phenol (MW=3000, hydroxyl value=120, by Maruzen Sekiyu Co.), and 63 pt. of brominated poly-p-vinyl phenol (bromine content 50%, hydroxyl value=234, by Maruzen Sekiyu Co.) were dissolved in methyl ethyl ketone. Then, in the solution thus prepared, 1 pt. of di-n-butyl tin diacetate as hardening promotor was added, and an epoxy resin composite varnish was prepared. Thereafter, by taking the same process as in Example 1, a hardened epoxy resin was obtained.

COMPARISON EXAMPLE 1

In lieu of di-n-butyl tin dimaleate, benzyldimethylamine was used. Except the above, the same method as in Example 1 was used, and a hardened epoxy resin was obtained.

COMPARISON EXAMPLE 2

Instead of di-n-butyl tin dimaleate, 2-methylimidazoleacetate was used. Otherwise, the same method as in Example 1 was used, and a hardened epoxy resin was obtained.

COMPARISON EXAMPLE 3

One hundred pt. of bisphenol type epozy resin (Epicote® 828), 26 pt. of diaminodiphenylmethane, and 1 pt. of benzyldimethylamine were dissolved in methyl ethyl ketone, and an epoxy resin composite varnish was obtained. Thereafter, by using the same method as in Example 1, a hardened epoxy resin was obtained.

COMPARISON EXAMPLE 4

One hundred pt. of bisphenol type epoxy resin (Epicote® 828), 51.5 pt. of maleic anhydride, and 1 pt. of benzyldimethylamine were dissolved in methyl ethyl ketone, and an epoxy resin composite varnish was obtained. Thereafter, by using the same method as in Example 1, hardened epoxy resin was obtained.

The gelation time of the epoxy resin composite varnishes in examples and comparison examples described above, and the glass transition temperature as well as the flame resistance of the hardened epoxy resin obtained by hardening said epoxy resin composite varnishes were measured and the results are shown in Table 1. As in clearly understood from the table, the epoxy resin composite varnishes in examples are relatively long in gelation time thus allowing the easy handling as well as providing the outstanding storage stability, and are capable of providing a hardened product with excellent heat resistance (high in glass transition temperature).

TABLE 1

| | Glass transition*1 temperature (°C.) | Gelation time*2 | Flame*3 resistance |
|---|---|---|---|
| Example 1 | 206 | 8'00" | HB |
| Example 2 | 204 | 8'30" | HB |
| Example 3 | 205 | 8'20" | HB |
| Example 4 | 215 | 7'45" | HB |
| Example 5 | 202 | 7'10" | V-0 |
| Comparison example 1 | 163 | 3'40" | HB |
| Comparison example 2 | 200 | 3'50" | HB |
| Comparison example 3 | 144 | 8'25" | HB |
| Comparison example 4 | 123 | 5'20" | HB |

*1The epoxy resin hardening product was cut into 5 × 5 × 30 mm in dimension, and by measuring with dilatometer, heated in the range from room temperature to 300° C. at 2.5° C. min. in heating rate, and the glass transition temperature was obtained from the inflextion point of the thermal expansion curve.
*2The gelation time was measured by Stroke Cure Method (i.e.: the time taken by the resin until it ceases the threading after starting to heat the 50% resin composite varnish on a 160° C. hot plate).
*3For the flame resistance, UL 94 was applied. For example, the hardened epoxy resin was used by cutting it into dimensions of 1.6 × 12.5 × 127 mm.

Next, the case of using the silane compound containing an alcoxy group shown in (2) in the above as a hardening promotor will be described.

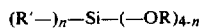

Of said silane compounds represented by the general formula shown above, those which are 0 in n, i.e., Si(OR)4, are called the silicic acid ester, and those having 1–3 for n are called organoalcoxysilane. The alcoxy group-containing silane compounds as mentioned above include: tetramethoxysilane(tetramethyl orthosilicate), tetraethoxysilane (tetraethyl orthosilicate), tetra-n-propoxysilane (tetra-n-propyl orthosilicate), tetra-iso-propoxysilane (tetra-isopropyl orthosilicate), tetra-n-butoxysilane (tetra-n-butyl orthosilicate), monomethyl trimethoxysilane, dimethyl dimethoxysilane, monoethyl triethoxysilane, diethyl diethoxysilane, diphenyl diethoxysilane, mono-n-propyl triethoxysilane, di-n-propyl dibutoxysilane, di-n-butyl diethoxysilane.

As compounding amount of hardening promotor, usually, 0.05–5.0 pt. compared with 100 part by weight of epoxy resin is selected. It means that the maximum effect can be obtained within said range.

As has been described above, because in the epoxy resin composition used according to this invention, at least either one out of poly-p-vinyl phenol and its halide is compounded with alcoxy-bearing silane compound represented by the previously shown general formula, it is long in geleation time thereby facilitating its handling as well as improving the storage stability, and is capable to form the hardened product with high heat resistance. Therefore, the epoxy resin composition of this invention is most appropriate for prepreg of print substrate. Also, if necessary, the publicly known hardening promotor may be compounded with the epoxy resin composition of this invention. As publicly known hardening promotor, there are those such as benzyldimethylamine, imidazoles. Usually, these hardening promoters affect to shorten the gelation time and lower the storage stability. However, when said hardening promotors are used together with at least either poly-p-vinyl phenol or its halide, in addition to the alcoxy-containing silane compound having the aforementioned general formula, said drawbacks can be prevented, furthermore, the hardened product with markedly high heat resistance can be produced.

Next, the description will hereunder be given of the examples of the present invention together with the comparison examples.

EXAMPLE 6

One hundred pt. of bisphenol type epoxy resin (Epicote® 827, by Shell Co.), 66 pt. of poly-p-vinyl phenol (Resin M by Maruzen Sekiyu Co., MW 3000, hydroxyl value=120) and 1 pt. of tetraethoxysilane as a hardening promotor were dissolved in methyl ethyl ketone, and the epoxy resin composite varnish of 50% by weight in concentration was obtained. Then, said varnish was solidified by removing the solvent through drying under reduced pressure. Thereafter, said solid material was heated at 170° C. for 2 hours, then at 200° C. for 3 hours, and an epoxy resin hardened product was obtained.

EXAMPLE 7

Instead of tetraethoxysilane, diphenyl diethoxysilane was used. Other than the above, the same method as in Example 6 was used, and an epoxy resin hardened product was obtained.

EXAMPLE 8

Instead of tetraethoxysilane, tetra-n-butoxysilane was used. Otherwise, by using the same method as in Example 6, an epoxy resin hardened product was obtained.

EXAMPLE 9

One hundred pt. of novolak type epoxy resin (Epicote® 154, by Shell Co.), 67 pt. of poly-p-vinyl phenol (Resin M by Maruzen Sekiyu Co., MW 3500, hydroxyl value=120) and 0.2 pt. of tetraethoxysilane as hardening promotor were dissolved in methyl ethyl ketone, and the epoxy resin composite varnish was obtained. From said stage on, by using the same method as in Example 6, an epoxy resin hardened product was obtained.

EXAMPLE 10

One hundred pt. of bisphenol type epoxy resin (Epicote ® 828), 33 pt. of poly-p-vinyl phenol (Resin M by Maruzen Sekiyu Co., MW 4000, hydroxyl valuve = 120), 63 pt. of brominated poly-p-vinyl phenol (Resin MB by Maruzen Sekiyu Co., bromine content 49%, hydroxyl value = 234), and 1 pt. of diphenyl diethoxysilane as hardening promotor were dissolved in methyl ethyl ketone, and the epoxy resin composite varnish was obtained. After that, by using the same method as in Example 6, an epoxy resin hardened product was obtained.

COMPARISON EXAMPLE 5

In place of tetraethoxysilane, benzyldimethylamine was used. Except the above, by using the method same as in Example 6, an epoxy resin hardened product was obtained.

COMPARISON EXAMPLE 6

Instead of tetraethoxysilane, 2-methylimidazoleacetate was used. Other than the above, the method same as in Example 6 was used, and an epoxy resin hardened product was obtained.

COMPARISON EXAMPLE 7

One hundred pt. of bisphenol type epoxy resin (Epicote ® 828), 26 pt. of diaminodiphenylmethane, and 1 pt. of benzyldimethylamine were dissolved in methyl ethyl ketone, and the epoxy resin composite varnish was obtained. Thereafter, by using the method same as in Example 6, an epoxy resin hardened product was obtained.

COMPARISON EXAMPLE 8

One hundred pt. of bisphenol type epoxy resin (Epicote ® 828), 51.5 pt. of maleic anhydride, and 1 pt. of benzyldimethylamine were dissolved in methyl ethyl ketone, and the epoxy resin composite varnish was obtained. Thereafter, by the same method used as in Example 6, an epoxy resin hardened product was obtained.

The gelation time of the epoxy resin composite varnishes prepared in foregoing examples and comparison examples, and the glass transition temperature as well as the flame resistance of the epoxy resin hardened products obtained by hardening the above-mentioned epoxy resin composite varnishes were measured and the results are shown in Table 2.

As is clearly understood from said table, the epoxy resin composite varnishes in examples are relatively long in gelation time thereby facilitating their handling and giving excellent storage stability; also, they are capable of providing a hardened product with remarkable heat resistance (i.e., the glass transition temperature is high).

TABLE 2

| | Glass transition*4 temperature (°C.) | Gelation*5 Time | Flame*6 resistance |
| --- | --- | --- | --- |
| Example 6 | 196 | 5'50" | HB |
| Example 7 | 193 | 6'10" | HB |
| Example 8 | 197 | 6'30" | HB |
| Example 9 | 198 | 7'00" | HB |
| Example 10 | 196 | 6'15" | V-0 |
| Comparison example 5 | 160 | 3'45" | HB |
| Comparison example 6 | 198 | 3'40" | HB |
| Comparison example 7 | 145 | 8'30" | HB |
| Comparison example 8 | 120 | 5'30" | HB |

*4, *5, *6: Same condition as stated on *1, *2, and *3, respectively.

Furthermore, the case to use the aluminic acid ester set forth in (3) in the above hardening promotor will be described.

[Al(OR)$_3$]$_n$

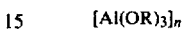

In the formula shown above, as organic group R, practically, the following are preferable: methyl group, ethyl group, n-propyl group, iso-propyl group, n-butyl group, iso-butyl group, sec-butyl group, tert-butyl group, pentyl group, hexyl group, heptyl group, octyl group, nonyl group, decyl group, phenyl group, benzyl group, o-tolyl group, p-tolyl group, m-tolyl group, o-xylyl group, p-xylyl group, and m-xylyl group.

The composition by weight for hardening promotor is usually selected to be that the hardening promotor is 0.05–5.0 pt. compared with 100 pt. of epoxy resin. In other words, the effect is maximum in the range stated above.

It should be apparent from the foregoing description that since the epoxy resin composition of this invention contains at least either poly-p-vinyl phenol or its halides, mixed with aluminic acid ester represented by the previously mentioned general formula, it is long in gelation time resulting in easy handling as well as high storage stability, and is capable of providing a highly heat resistant hardened product. Consequently, the epoxy resin composition of this invention is most suitable for a prepreg for circuit substrates. Also, the epoxy resin composition of this invention may be compounded with publicly known hardening promotor when it is necessary.

As publicly known hardening promotor, same as in the case using the silane compound as set forth in (2) as hardening promotor, benzyldimethylamine and imidazoles are preferable. Said hardening promotor usually affect to decrease the gelation time of epoxy resin composition and lower the storage stability. However, when said hardening promoter are used together with at least one out of either poly-p-vinyl phenol or its halides in addition to aluminic acid ester represented by the previously shown general formula, not only that the disadvantages mentioned above are not caused, but also the hardened product with markedly high heat resistance can be formed.

Next, the description will be given as to the examples and the comparison examples.

EXAMPLE 11

One hundred pt. of bisphenol type epoxy resin (Epicote ® 828, by Shell Co.) and 64 pt. of poly-p-vinyl phenol (Resin M by Maruzen Sekiyu Co., MW 3000, hydroxyl value = 120) were dissolved in methyl ethyl ketone. Also, as a hardening promotor, 1 pt. of aluminum isopropoxide was added, and the epoxy resin composite varnish of 50% by weight in concentration was obtained. Then, said varnish was solidified by drying under reduced pressure for removing the solvent. Following the above, said solid was heated at 170° C. for 2 hours, then at 200° C. for 3 hours, and an epoxy resin hardened product was obtained.

EXAMPLE 12

In place of aluminum isopropoxide, aluminum ethoxide was used. Except the above, the same method as in Example 11 was used for obtaining a hardened epoxy resin.

EXAMPLE 13

Instead of aluminum isopropoxide, aluminum-tert-butoxide was used. Other than the above, by using the same method as in Example 11, an epoxy resin hardened product was obtained.

EXAMPLE 14

One hundred pt. of novolak type epoxy resin (Epicote ® 154, by Shell Co.) and 67 pt. of poly-p-vinyl phenol (Resin M by Maruzen Sekiyu Co., MW 4000, hydroxyl value=120) were dissolved in methyl ethyl ketone. Also, as hardening promotor, 0.2 pt. of aluminum isopropoxide was added for obtaining the epoxy resin composite varnish. Thereafter, by using the same process as in Example 11, an epoxy resin hardened product was obtained.

EXAMPLE 15

One hundred pt. of bisphenol type epoxy resin (Epicote ® 828), 33 pt. of poly-p-vinyl phenol (Resin M by Maruzen Sekiyu Co., MW 3000, hydroxyl value=120), and 63 pt. of brominated poly-p-vinyl phenol (Resin MB by Maruzen Sekiyu Co., bromine content 50%, hydroxyl value=234) were dissolved in methyl ethyl ketone. Furthermore, 1 pt. of aluminum isopropoxide as hardening promotor was added, and the epoxy resin composite varnish was obtained. Thereafter, by using the same method as in Example 11, an epoxy resin hardened product was obtained.

COMPARISON EXAMPLE 9

Except that aluminum isopropoxide was replaced by benzyldimethylamine, the same process as in Example 11 was taken, and an epoxy resin hardened product was obtained.

COMPARISON EXAMPLE 10

In lieu of aluminum isopropoxide, 2-methylimidazoleacetate was used. Other than the above, the same method as in Example 11 was used, and an epoxy resin hardened product was obtained.

COMPARISON EXAMPLE 11

One hundred pt. of bisphenol type epoxy resin (Epicote ® 828), 26 pt. of diaminodiphenylmethane and 1 pt. of benzyldimethylamine were dissolved in methyl ethyl ketone, and the epoxy resin composite varnish was prepared. Thereafter, by taking the same steps as in Example 11, an epoxy resin hardened product was obtained.

COMPARISON EXAMPLE 12

One hundred pt. of bisphenol type epoxy resin (Epicote ® 828), 51.5 pt. of maleic anhydride, and 1 pt. of benzyldimethylamine were dissolved in methyl ethyl ketone, and the epoxy resin composite varnish was obtained. Thereafter, by using the same method as in Example 11, an epoxy resin hardened product was obtained.

The gelation time of the epoxy resin composite varnishes prepared in foregoing examples and comparison examples, in addition to glass transition temperature and the flame resistance of the epoxy resin hardening products obtained by hardening said epoxy resin composite varnishes were measured, and the results are shown in Table 3.

As is apparent from the table, the epoxy resin composite varnish in examples is relatively long in gelation time and easy to handle as well as excellent in storage stability, and is capable to give the hardened product with remarkable heat resistance (high in glass transition temperature).

TABLE 3

| | Glass transition*[7] temperature (°C.) | Gelation*[8] Time | Flame*[9] resistance |
|---|---|---|---|
| Example 11 | 198 | 6'20" | HB |
| Example 12 | 194 | 5'50" | HB |
| Example 13 | 197 | 6'40" | HB |
| Example 14 | 200 | 7'10" | HB |
| Example 15 | 196 | 6'10" | V-0 |
| Comparison example 9 | 160 | 3'45" | HB |
| Comparison example 10 | 198 | 3'40" | HB |
| Comparison example 11 | 145 | 8'30" | HB |
| Comparison example 12 | 120 | 5'30" | HB |

*[7], *[8], *[9]: Same condition as *[1], *[2], *[3], respectively.

Hereunder, the description will be given on the production of epoxy resin prepared by using the epoxy resin composition mentioned above.

Since the epoxy resin composition composed of the components mentioned above is soluble in the solvents, such as acetone, methyl ethyl ketone, acetylacetone, methyl acetate, ethyl acetate, butyl acetate, methyl cellosolve, ethyl cellosolve, butyl cellosolve, methyl cellosolve acetate, ethyl cellosolve acetate, N,N-dimethyl formamide, N,N-dimethylacetamide, dimethyl sulfoxide, N-methyl-2-pyrrolidone, it can be formed into varnish by dissolving in those solvents. Then, by impregnating said varnish in base materials, such as glass, and drying, a prepreg can be produced.

However, usually, in production of prepreg, for the purpose of production efficiency, it is necessary to carry out the drying at 140° C. or above, preferably at about 160° C.; and when the prepreg is produced with varnish using the abovementioned solvents in single form, only a prepreg having the following defects can be obtained: for example, when the prepreg is produced with varnish using the ketone series solvent or acetic acid ester in single form, a prepreg with substantial foaming is obtained; also, when the prepreg is produced with varnish using the cellosolve solvent in single form, only the foamed prepreg is obtained; furthermore, when the prepreg is produced with varnish using the cellosolve acetate solvent or high boiling point polar solvent in single form, only the prepreg with solvent remaining in it is obtained. In the foregoing cases, the drying process is stopped within the limit enabling the laminate molding of prepreg after drying, and the resin content of prepreg is set to be in the range of 40-60% (weight; the same is applied hereunder) that is used for the production of laminate.

As is mentioned above, if a desirable prepreg cannot be obtained by using the solvent in single form, usually, the solution of the problem is attempted through the use of mixed solvent prepared by mixing the two types of solvents, i.e., the low boiling point solvent and high boiling point solvent. However, for the epoxy resin composition wherein the aforementioned compounds are compounded, even when the mixed varnish containing the low boiling point solvent as well as the high boiling point solvent was used, a satisfactory prepreg could not be obtained, as mentioned below. For example, by the use of cellosolve solvent and ketone type solvent, only the foamed prepreg was obtained. By the use of cellosolve acetate solvent and ketone type solvent, at 0.22 or above in (former)/(latter) weight ratio, only a prepreg with residual solvent could be obtained, while at below 0.22 in said weight ratio, only a foamed prepreg was obtained. Furthermore, by the use of high boiling point polar solvent and ketone series solvent, at 0.17 or above in (former)/(latter) weight ratio, only a prepreg with residual solvent could be obtained; while at below 0.17 in said weight ratio, only a foamed prepreg was obtained. Also when the acetic acid ester was used instead of ketone series solvent, the result was totally identical with that mentioned above. By the use of cellosolve acetate solvent and cellosolve solvent, at 0.29 or above in (former)/(latter) weight ratio, only a prepreg with residual solvent could be obtained; while at below 0.29 in said weight ratio, only a foamed prepreg was obtained.

As has been mentioned above, it was very difficult to produce the desirable prepreg that is homogeneous without foaming and free of residual solvent continuously on a production, by using the varnish prepared by dissolving the epoxy resin composition containing the previously mentioned compounds compounded in it in a solvent.

With the aforesaid conditions as a background, the inventors of the present invention further conducted the strenuous studies, and achieved this invention through finding out the fact that the continuous production of the desirable prepreg in production line by using the mixed solvent prepared by mixing 15–30 pt. of ketone series solvent with boiling point of 50°–90° C., 6–15 pt. of cellosolve solvent with boiling point of 110°–140° C., 2–6 pt. of cellosolve acetate solvent and/or polar solvent each with boiling point of 140°–160° C. is possible.

In other words, the essential point of this invention is the use of varnish prepared by dissolving the epoxy resin composition composed of the foregoing components in mixed solvent obtained by mixing 15–30 pt. of ketone series solvent with boiling point of 50°–90° C., 6–15 pt. of cellosolve solvent with boiling pont of 110°–140° C., and 2–6 pt. of cellosolve acetate solvent and/or polar solvent each with boiling point of 140°–160° C.

As a preferable ketone series solvent, there are acetone, methyl ethyl ketone; and as cellosolve solvent, there are methyl cellosolve, ethyl cellosolve; also, as cellosolve acetate solvent and polar solvent, there are methyl cellosolve acetate, ethyl cellosolve acetate, N,N-dimethyl formamide, etc.

In the aforesaid mixed solvent, when the ketone series solvent with boiling point of 50°–90° is less than 15 pt., the high boiling point solvent remains in the prepreg; while when said ketone series solvent is over 30 pt., the prepreg foams. Also, less than 6 pt. and more than 15 pt. of cellosolve solvent with boiling point of 110°–140° C. in said solvent causes the prepreg to foam. Furthermore, when at least either one of cellosolve acetate solvent or polar solvent with boiling point of 140°–160° C. is less than 2 pt., the prepreg foams; while said solvent is over 6 pt., the high boiling point solvent remains in prepreg. That is why it is necessary for the compounding ratio of the mixed solvent to be set as described above.

There is no specific limit set for said method to prepare the varnish by using the epoxy resin composition and the mixed solvent. For example, the epoxy resin composition may be dissolved directly in the mixed solvent, or it may be dissolved first in single solvent, then, diluted with the other component solvent. The point is to obtain the varnish in a form having said epoxy resin composition dissolved in the mixed solvent. Also, either heating or not heating during the preparation of the varnish is optional. In addition, the concentration of varnish is not specifically defined, but usually, it is set at 40–80%.

By impregnating the varnish thus obtained in the base material and then drying, the prepreg is obtained. In this case, the base material is not specifically defined, and those commonly used may be employed. For example, cloth, mat or paper form material made of organic or inorganic fiber is used. The method for impregnating the varnish is not limited either. It may be either coating or immersion. It is preferable to limit the resin content of prepreg to be 40–60%. There is no limit as to drying method for the prepreg. Generally, vapor dryer, electric heat dryer, infrared heat dryer, high frequency heat dryer, etc. are used. For the drying temperature, it is preferable to set it at 140° C. or above, and more preferably, at 160° C.

The prepreg obtained in this manner is quite excellent and neither contains high boiling point solvent nor foams.

According to this invention, the prepreg is produced by using the varnish in the foam wherein the foregoing epoxy resin composition is dissolved in a mixed solvent with said composition; therefore, a desirable prepreg that is free of foam and residual solvent (capable to yield the highly heat resistant product) can be produced continuously on production basis.

Next, the description will be given on examples together with comparison examples and reference examples.

EXAMPLE, COMPARISON EXAMPLE, REFERENCE EXAMPLE

An epoxy resin composition prepared by compounding 43 kg of novolak type epoxy resin (N-740, by Dainihon Ink Co.), 16 kg of poly-p-vinyl phenol (Resin M, by Maruzen Sekiyu Co.), 22 kg of brominated poly-p-vinyl phenol (Resin NB, by Maruzen Sekiyu Co.), and 0.086 kg of di-n-butyl tin dimaleate (N2000-C, by Nitto Kasei Co.) was added in a covered stainless container containing 44 kg of mixed solvent prepared by mixing the solvents shown in the table below with the ratio shown in said table (some of the reference examples use the single solvent) while stirring, and dissolved completely for obtaining the varnish.

Then, said varnish was coated on 0.1 mm thick glass cloth (WE-116E104, by Nitto Boseki Co.) with arrangement that the solid resin content after drying becomes 50%, and immediately thereafter, dried by using the hot vapor type dryer, thus the prepreg of which the resin is gelated in 3-5 minutes on 160° C. hot plate was obtained.

The appearance of the prepreg thus obtained and the measuring result for coefficient of water absorbtion of the 1.6 mm thick laminate obtained by molding of said prepreg are shown in the right columns of Table 4. The coefficient of water absorption was measured in accordance with JIS C6481. When the solvent remains in prepreg, in proportion to the quantity of said residual solvent, the water absorption coefficient of the laminate increases.

In the table, A represents the ketone type solvent with boiling point of 50°-90° C., B denotes the cellosolve solvent with boiling point of 110°-140° C., and C denotes at least either one of cellosolve acetate solvent or polar solvent with boiling point of 140°-160° C.

second compound selected from the group consisting of:
(a) Sn salt of organic acid, wherein at least one organic group is bonded with Sn atom;
(b) silane compound containing alcoxy group, represented by the following general formula, $$(R'-)_n-Si-(-OR)_{4-n}$$

wherein, R' denotes an alkyl group or an allyl group, R denotes a normal chain or branched alkyl group, and n denotes 0 or an integer of 1-4,
(c) aluminic acid ester, represented by the following general formula, $$[Al(OR)_3]_n$$

TABLE 4

| | Solvent type | | | Solvent ratio by weight | | | Appearance of prepreg | Water absorption coefficient of laminate (%) |
|---|---|---|---|---|---|---|---|---|
| | A | B | C | A | B | C | | |
| Example 1 | MEK | MC | MCA | 15 | 6 | 2 | NF | 0.14 |
| Example 2 | " | " | " | 20 | 10 | 4 | NF | 0.14 |
| Example 3 | " | " | " | 30 | 15 | 6 | NF | 0.13 |
| Example 4 | " | " | " | 23 | 6 | 6 | NF | 0.15 |
| Example 5 | " | " | ECA | 23 | 15 | 2 | NF | 0.12 |
| Example 6 | " | " | DMF | 30 | 15 | 2 | NF | 0.13 |
| Example 7 | " | EC | MCA | 23 | 6 | 5 | NF | 0.14 |
| Example 8 | " | " | ECA | 30 | 6 | 3 | NF | 0.13 |
| Comparison Example 1 | " | MC | MCA | 10 | 10 | 4 | SF | 0.21 |
| Comparison Example 2 | " | " | " | 40 | 10 | 4 | F | 0.13 |
| Comparison Example 3 | " | " | " | 23 | 2 | 4 | F | 0.14 |
| Comparison Example 4 | " | " | " | 23 | 10 | 8 | NF | 0.22 |
| Comparison Example 5 | " | " | DMF | 30 | 20 | 2 | F | 0.18 |
| Comparison Example 6 | " | EC | MCA | 23 | 6 | 0.5 | F | 0.13 |
| Reference Example 1 | — | MC | ECA | — | 2 | 1 | NF | 0.24 |
| Reference Example 2 | MEK | — | — | Single | — | — | F | 0.12 |
| Reference Example 3 | — | — | ECA | — | — | Single | NF | 0.25 |

(Note 1)
MEK: Methyl ethyl ketone
MC: Methyl cellosolve
EC: Ethyl cellosolve
MCA: Methyl cellosolve acetate
ECA: Ethyl cellosolve acetate
DMF: N,N—dimethyl formamide
(Note 2) Appearance of prepreg
NF: Homogeneous free of foam and unevenness
SF: Slight foaming
F: Foamed As must be understood clearly from the table shown above, according to the examples, in every case, the homogenous prepreg with satisfactory appearance (foamless), having no residual solvent, can be produced in production line.

What is claimed is:
1. An epoxy resin composition consisting of:
an epoxy resin having at least two epoxy groups per molecule mixed with a first compound or a mixture thereof selected from the group consisting of poly-p-vinyl phenol and its halides wherein compounding quantity of said first compound or mixture is within the range of 0.5 to 2.0 in molar ratio of (epoxy group of epoxy resin composition)/(active hydrogen of said first compound or mixture) and a wherein, n denotes an integer of 1-5, and R denotes an alkyl group or an allyl group.
2. Epoxy resin composition according to claim 1, wherein said second compound is a Sn salt of organic acid containing at least one organic group bonded with said Sn atom.
3. Epoxy resin composition according to claim 2, wherein said Sn salt is a compound represented by the following general formula (I), (II), or (III):

$$R_n-Sn-(-O-\overset{\overset{\displaystyle O}{\|}}{C}-R')_{4-n} \quad (I)$$

wherein, R denotes an monovalent organic group, R' denotes an organic acid residue, and n denotes an integer of 1-3;

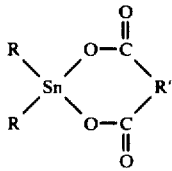 (II)

wherein, R and R' are same as those defined in foregoing formula (I), and both R and R' may be identical or different;

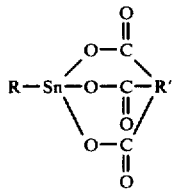 (III)

wherein, R and R' are same as those described in foregoing formula (I).

4. Epoxy resin composition according to claim 3, wherein R' represents an organic acid residue having a free carboxyl group.

5. Epoxy resin composition according to claim 1 or 2, wherein said Sn salt is at least one tin salt of organic salt selected from the group consisting of di-n-butyl tin dimaleate, di-n-butyl tin dilaurate, dioctyl tin dilaurate, and di-n-butyl tin diacetate.

6. Epoxy resin composition according to claim 1, wherein said second compound is alcoxy-bearing silane compound.

7. Epoxy resin composition according to claim 1, wherein said second compound is an aluminic acid ester.

8. Epoxy resin composition according to claim 7, wherein said aluminic acid ester is at least one compound selected from the group consisting of aluminum-isopropoxide, aluminum ethoxide and aluminum-tert-butoxide.

9. Epoxy resin composition according to claim 7 or 8, wherein 0.05-5.00 pt. of aluminic acid ester is compounded with 100 pt. of epoxy resin.

10. A method for producing an epoxy resin prepreg through impregnating an epoxy resin composite varnish a base material, characterized in that said varnish is prepared by dissolving an epoxy resin composition in a solvent prepared by mixing 15-30 pt. of ketone system solvent with a boiling point of 50°-90° C., 6-15 pt. of cellosolve solvent with a boiling point of 110°-140° C., and 2-6 pt. of cellosolve acetate solvent and/or polar solvent with a boiling point of 140°-160° C.; and said epoxy composition consisting of an epoxy resin having at least two epoxy groups per molecule mixed with a first compound or mixture thereof selected from the group consisting of poly-p-vinyl phenol and its halides wherein the compounding quantity of said first compound or mixture is within the range of 0.5-2.0 in molar ratio for an (epoxy group of epoxy resin)/(active hydrogen of said first compound or mixture) and a second compound selected from the group consisting of Sn salt of organic acid in which at least one organic acid group is bonded with Sn atom, aluminic acid ester represented by the general formula (I) shown below, and alcoxy group-containing silane compound represented by the general formula (II) shown below,

 (I)

wherein, n denotes an integer of 1-5, and R denotes an alkyl group or an allyl group;

 (II)

wherein, R' denotes an alkyl group or an allyl group, R denotes a normal chain or branched alkyl group, and n denotes an integer of 0-4.

11. A method for producing an epoxy resin prepreg according to claim 10, wherein said second compound is a Sn salt or mixture thereof selected from the group consisting of di-n-butyl tin dimaleate, di-n-butyl tin dilaurate, dioctyl tin dilaurate, and di-n-butyl tin diacetate.

12. A method for producing the epoxy resin prepreg according to claim 10 or 11, wherein said second compound is compounded in the epoxy resin composition at the ratio of 0.05-5.00 pt. compared with 100 pt. of epoxy resin.

* * * * *